(12) United States Patent
Cheng et al.

(10) Patent No.: US 10,651,292 B2
(45) Date of Patent: May 12, 2020

(54) DUAL METAL VIA FOR CONTACT RESISTANCE REDUCTION

(71) Applicant: Taiwan Semiconductor Manufacturing Co., Ltd., Hsinchu (TW)

(72) Inventors: Chung-Liang Cheng, Changhua County (TW); Yen-Yu Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/898,706

(22) Filed: Feb. 19, 2018

(65) Prior Publication Data

US 2019/0259855 A1 Aug. 22, 2019

(51) Int. Cl.
*H01L 29/66* (2006.01)
*H01L 21/768* (2006.01)
*H01L 29/78* (2006.01)
*H01L 29/06* (2006.01)
*H01L 29/423* (2006.01)
*H01L 21/762* (2006.01)
*H01L 21/285* (2006.01)

(52) U.S. Cl.
CPC .. *H01L 29/66636* (2013.01); *H01L 21/28518* (2013.01); *H01L 21/76224* (2013.01); *H01L 21/76843* (2013.01); *H01L 21/76855* (2013.01); *H01L 29/0653* (2013.01); *H01L 29/42364* (2013.01); *H01L 29/6653* (2013.01); *H01L 29/66795* (2013.01); *H01L 29/7851* (2013.01); *H01L 29/7853* (2013.01)

(58) Field of Classification Search
CPC ............ H01L 23/481; H01L 21/28518; H01L 21/76224; H01L 21/76843; H01L 21/76855; H01L 29/66636; H01L 29/0653; H01L 29/42364; H01L 29/6653; H01L 29/66795; H01L 29/7851; H01L 29/7853
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,478,636 B2 | 10/2016 | Chen et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,633,999 B1 | 4/2017 | Lu et al. |
| 9,831,183 B2 | 11/2017 | Lin et al. |

(Continued)

FOREIGN PATENT DOCUMENTS

KR 20050029517 3/2005

*Primary Examiner* — Tucker J Wright
*Assistant Examiner* — Scott Stowe
(74) *Attorney, Agent, or Firm* — Haynes and Boone, LLP

(57) ABSTRACT

A semiconductor device includes an active region over a substrate; a first cobalt-containing feature disposed over the active region; a conductive cap disposed over and in physical contact with the first cobalt-containing feature; and a second cobalt-containing feature disposed over and in physical contact with the conductive cap.

20 Claims, 15 Drawing Sheets

(56) References Cited

U.S. PATENT DOCUMENTS

| | | |
|---|---|---|
| 9,859,386 B2 | 1/2018 | Ho et al. |
| 2014/0183738 A1* | 7/2014 | Jezewski ............... H01L 23/485 |
| | | 257/751 |
| 2014/0327140 A1 | 11/2014 | Zhang et al. |
| 2015/0235957 A1 | 8/2015 | Zhang et al. |
| 2018/0158781 A1* | 6/2018 | Jung ................. H01L 23/53238 |

* cited by examiner

DUAL METAL VIA FOR CONTACT RESISTANCE REDUCTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, tungsten (W) plugs with titanium (Ti) and titanium nitride (TiN) barrier layers have been traditionally used as via plugs in metal interconnect. As the down-scaling continues, via plugs also become smaller and smaller, and such W plugs exhibit increased resistance and become unsuitable in some instances. Improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
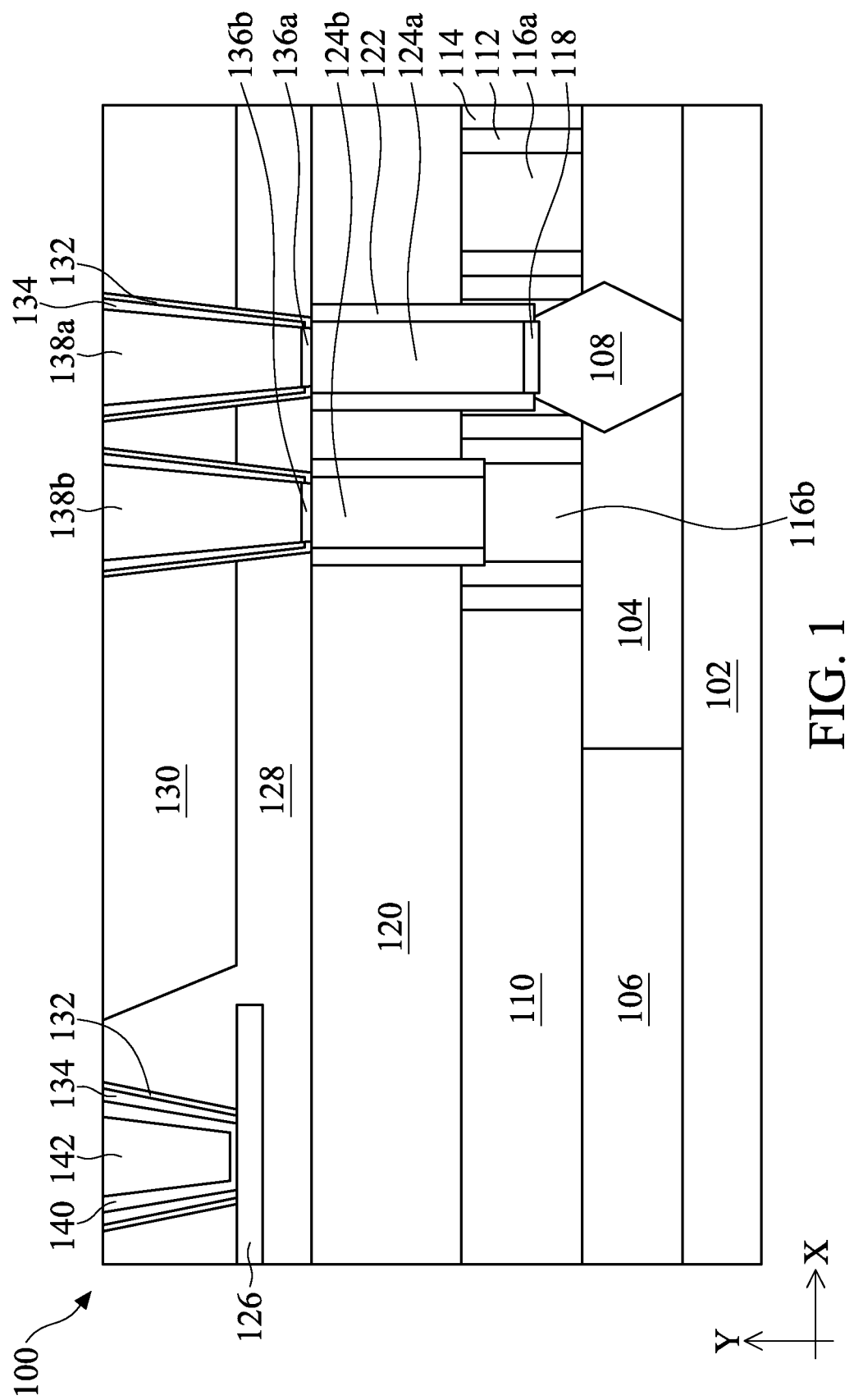
FIG. 1 shows a cross-sectional view of a semiconductor structure constructed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to plugs for interconnecting conductive features between different layers of an integrated circuit (IC). A plug is sometimes referred to as a via plug or a contact plug. An object of the present disclosure is to provide plugs that have lower electrical resistance than traditional W plugs. In some embodiments of the present disclosure, some new plugs include cobalt (Co) as the main plug feature and further include dual barrier layers having titanium nitride (TiN) and silicon nitride ($Si_3N_4$) that insulate the Co plug feature from nearby dielectric layers (e.g., silicon oxide layer(s)). Additionally or alternatively, some new via plugs include ruthenium (Ru) as the main plug feature and further include TiN or tantalum nitride (TaN) as a barrier layer. Both Co plugs and Ru plugs provide lower electrical resistance than traditional W plugs. Hereinafter, the term "Co plug," "Co-containing plug," "cobalt-containing plug," or the like refers to a plug that includes or comprises cobalt (Co); and the term "Ru plug," "Ru-containing plug," "ruthenium-containing plug," or the like refers to a plug that includes or comprises ruthenium (Ru).

FIG. 1 illustrates a cross-sectional view of a semiconductor device (or semiconductor structure) 100, constructed according to aspects of the present disclosure. Referring to FIG. 1, the device 100 includes a substrate 102, active regions 104 (one shown), and an isolation structure 106 that isolate the active regions 104 from one another. Various active and passive devices are built in or on the active regions 104, such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, static random access memory (SRAM) cells, other memory cells, resistors, capacitors, and inductors.

The device 100 further includes transistor source/drain (S/D) features 108 (one shown); transistor gate features (or gate structures or gate stacks) 116 including 116a and 116b; gate spacers 112 and 114; dielectric layers (or interlayer dielectric layers) 110, 120, and 130; Co-containing plugs 124 (including 124a and 124b) and 138 (including 138a and 138b); Ru-containing plugs 142 (one shown); via barrier layers 122, 132, 134, and 140; silicide features 118 (one shown), conductive caps 136 (including 136a and 136b); a contact etch stop layer (CESL) 128, and a conductive feature 126. The device 100 may include various other features not shown in FIG. 1. The components of device 100 are further described below.

The substrate 102 is a silicon substrate (e.g., a silicon wafer) in the present embodiment. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In embodiments, the substrate 102 may include indium tin oxide (ITO) glass, include silicon on insulator (SOI) substrate, be strained and/or stressed for performance enhancement, include epitaxial regions, doped regions, and/or include other suitable features and layers.

The active regions 104 may include one or more layers of semiconductor materials such as silicon or silicon germanium, and may be doped with proper dopants for forming active or passive devices. In an embodiment, the active regions 104 include multiple layers of semiconductor materials alternately stacked one over the other, for example, having multiple layers of silicon and multiple layers of silicon germanium alternately stacked. The active regions 104 may a planar structure, for example, for forming planar transistors (or 2D transistors). Alternatively or additionally, the active regions 104 may include three-dimensional (3D) structures such as fins, for example, for forming multi-gate transistors (or 3D transistors) such as FinFETs. The active regions 104 may be patterned by any suitable method. For example, the active regions 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the active regions 104. For example, the masking element may be used for etching recesses into semiconductor layers over or in the substrate 102, leaving the active regions 104 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the active regions 104 may be suitable.

The isolation structure 106 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 106 is formed by etching trenches in or over the substrate 102 (e.g., as part of the process of forming the active regions 104), filling the trenches with an insulating material, and performing a chemical mechanical planarization (CMP) process and/or an etching back process to the insulating material, leaving the remaining insulating material as the isolation structure 106. Other types of isolation structure may also be suitable, such as field oxide and LOCal Oxidation of Silicon (LOCOS). The isolation structure 106 may include a multi-layer structure, for example, having one or more liner layers on surfaces of the substrate 102 and the active regions 104 and a main isolating layer over the one or more liner layers.

The S/D features 108 may include n-type doped silicon for NFETs, p-type doped silicon germanium for PFETs, or other suitable materials. The S/D features 108 may be formed by etching recesses into the active regions 104 adjacent to the gate spacers 112 and 114, and epitaxially growing semiconductor materials in the recesses. The epitaxially grown semiconductor materials may be doped with proper dopants in-situ or ex-situ. The S/D features 108 may have any suitable shape and may be partially embedded in the active regions 104, such as shown in FIG. 1.

The gate spacers 112 may include a dielectric material, such as silicon oxide or silicon oxynitride. The gate spacers 114 may include a dielectric material, such as silicon oxide, silicon nitride, silicon oxynitride, silicon carbide, other dielectric material, or combinations thereof. The gate spacers 112 and 114 may be formed by deposition (e.g., chemical vapor deposition (CVD) or physical vapor deposition (PVD)) and etching processes.

Each gate stack 116 (e.g., 116a or 116b) may include a gate dielectric layer and a gate electrode layer, and may further include an interfacial layer under the gate dielectric layer. The interfacial layer may include a dielectric material such as $SiO_2$ or SiON, and may be formed by chemical oxidation, thermal oxidation, atomic layer deposition (ALD), CVD, and/or other suitable methods. The gate dielectric layer may include $SiO_2$ or a high-k dielectric material such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The gate dielectric layer may be deposited using CVD, PVD, ALD, and/or other suitable methods. The gate electrode layer may include polysilicon and/or one or more metal-containing layers. For example, the gate electrode layer may include work function metal layer(s), conductive barrier layer(s), and metal fill layer(s). The work function metal layer may be a p-type or an n-type work function layer depending on the type (PFET or NFET) of the device. The p-type work function layer comprises a metal selected from but not restricted to the group of titanium aluminum nitride (TiAlN), titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), titanium aluminum nitride (TiAlN), titanium silicon nitride (TiSiN), or combinations thereof. The metal fill layer may include aluminum (Al), tungsten (W), cobalt (Co), and/or other suitable materials. The gate electrode layer may be deposited using methods such as CVD, PVD, plating, and/or other suitable processes. The gate stacks 116 may be formed by any suitable processes including gate-first processes and gate-last processes. In an exemplary gate-first process, various material layers are deposited and patterned to become the gate stacks 116 before transistor source/drain features 108 are formed. In an exemplary gate-last process (also termed as a gate replacement process), temporary gate structures are formed first. Then, after transistor source/drain features 108 are formed, the temporary gate structures are removed and replaced with the gate stacks 116. In the present embodiment, the gate stack 116a is disposed over a channel region of a transistor and functions as a gate terminal. The device 100 may further include a Co-containing plug disposed over the gate stack 116a, although not shown in this cross-sectional view.

The dielectric layers 110, 120, and 130 are also referred to as interlayer dielectric (ILD) layers. Each of the ILD layers 110, 120, and 130 may comprise tetraethylorthosilicate (TEOS) oxide, un-doped silicate glass, or doped silicon oxide such as borophosphosilicate glass (BPSG), fluorinated silicate glass (FSG), phosphosilicate glass (PSG), borosilicate glass (BSG), and/or other suitable dielectric materials. Each ILD layer may be formed by plasma enhanced CVD (PECVD), flowable CVD (FCVD), or other suitable methods. The ILD layers 110, 120, and 130 may have the same or different materials.

In the present embodiment, the barrier layer 122 includes a dual barrier layer that includes a first barrier layer on sidewalls of the Co-containing plugs 124 (e.g., 124a and 124b), and a second barrier layer over sidewalls of the first barrier layer, for example, between the first barrier layer and the ILD layer 120. In an embodiment, the first barrier layer includes titanium nitride (TiN) or tantalum nitride (TaN). In an embodiment, the second barrier layer includes silicon nitride ($Si_3N_4$). The barrier layer 122 may be formed by CVD, ALD, or other suitable methods.

In an embodiment, a thickness of the barrier layer 122 is designed to be large enough so that cobalt elements from the Co-containing plugs 124 do not diffuse into nearby oxygen-containing dielectric layers such as the ILD layer 120. At the same time, the thickness of the barrier layer 122 is designed to be as small as possible to leave room for the plugs 124. The larger size of the plugs 124, the smaller resistance they provide. The inventors of the present disclosure have discovered that cobalt elements may diffuse about 1 nm to about 1.5 nm within the barrier layer 122. In an exemplary embodiment, the barrier layer 122 is designed to be about 2 nm to about 3 nm. In a further embodiment, the two layers in the barrier layer 122 are designed to have about the same thickness.

The Co-containing plug 124a is disposed over and is in electrical contact with the S/D feature 108. In the present embodiment, the plug 124a is connected to the S/D feature 108 through the silicide feature 118. In an alternative embodiment, the plug 124a is directly connected to the S/D feature 108 without the silicide feature 118. The silicide feature 118 may be formed by a process that includes depositing a metal layer, annealing the metal layer such that the metal layer reacts with the semiconductor material(s) in the S/D feature 108 to form silicide, and then removing the non-reacted metal layer. The silicide feature 118 may include nickel silicide, titanium silicide, cobalt silicide, or other suitable silicidation or germanosilicidation.

The Co-containing plug 124b is disposed over and is in electrical contact (directly or indirectly) with the gate stack 116b. The Co-containing plugs 124 (including 124a and 124b) may be formed by CVD, PVD, plating, or other suitable methods. In an embodiment, the plugs 124 and the barrier layer 122 are formed by a procedure that includes etching contact holes into the ILD layer 120, depositing the barrier layer 122 into the contact holes, partially removing the barrier layer 122 to expose the gate stacks 116a and 116b, optionally forming the silicide feature 118, and depositing the Co-containing plugs 124 into the contact holes.

The CESL 128 may comprise silicon nitride, silicon oxynitride, silicon nitride with oxygen (O) or carbon (C) elements, and/or other materials; and may be formed by CVD, PVD, ALD, or other suitable methods. The CESL 128 may include multiple layers (e.g., multiple dielectric layers deposited at different times).

The conductive feature 126 may include any suitable conductive material(s). In an embodiment, the conductive feature 126 provides high electrical resistance (or low electrical conductivity), for example, being part of a resistor. To further this embodiment, the conductive feature 126 may include titanium nitride or other suitable material(s). In an embodiment, the conductive feature 126 is formed by a procedure that includes depositing a conductive layer (e.g., TiN) over one of multiple layers of the CESL 128, forming a dielectric hard mask layer over the conductive layer, patterning the dielectric hard mask layer and the conductive layer, and depositing another one of the layers of the CESL 128, thereby embedding the conductive feature 126 (optionally the patterned hard mask layer) within the CESL 128.

In the present embodiment, the barrier layer 132 includes silicon nitride ($Si_3N_4$), the barrier layer 134 includes titanium nitride (TiN) or tantalum nitride (TaN), and the conductive cap 136 includes tungsten or cobalt silicide ($CoSi_x$ such as CoSi, $CoSi_2$, and/or $Co_2Si$). The features 132, 134, 136, and 138 may be formed by ALD, CVD, or other suitable methods.

In an embodiment, a total thickness of the barrier layers 132 and 134 is designed to be large enough so that cobalt elements from the Co-containing plugs 138 do not diffuse into nearby oxygen-containing dielectric layers such as the ILD layer 130 having $SiO_2$. At the same time, the total thickness of the barrier layers 132 and 134 are designed to be as small as possible to leave room for the plugs 138. The larger size of the plugs 138, the smaller resistance they provide. The inventors of the present disclosure have discovered that cobalt elements may diffuse about 1 nm to about 1.5 nm within the barrier layers 132 and 134. In an embodiment, the barrier layers 132 and 134 are designed to have about the same thickness and the total thickness of the barrier layers 132 and 134 is about 2 nm to about 3 nm.

In the present embodiment, the cobalt grains in the Co-containing plugs 124 and 138 are properly designed to fit into small via holes and to provide low resistance. In an embodiment, more than 60% of cobalt grains in each of the plugs 124 and 138 have a grain size about 11 nm to about 13 nm, and the rest of the cobalt grains therein have a grain size below 10 nm. Such grain sizes provide low resistance even in small via holes. The Co-containing plugs 138 and 124 provide lower resistance than traditional W plugs. This enables smaller circuits to be created and/or lower power consumption to be realized by the device 100.

The barrier layer 140 may include titanium nitride or tantalum nitride, and may be formed by ALD or other suitable methods. The Ru-containing plug 142 may be formed by CVD or other suitable methods. In the present embodiment, the Ru-containing plug 142 is disposed over and is in electrical contact with the conductive feature 126. For example, the Ru-containing plug 142 may serve as one terminal of the resistor including the conductive feature 126. The Ru-containing plug 142 provides lower resistance than traditional W plugs. This provides some benefits for the device 100. For example, the plug 142 contributes only a negligible resistance to the total resistance of the circuit path including the conductive feature 126. Therefore, the circuit path can be more accurately designed and fabricated.

In the present embodiments, the plugs 138 and 142 have trapezoidal cross-sectional profile where their bottom width is less than their respective top width. In an embodiment, their bottom width is more than 50%, but not more than 90%, of their respective top width. Such geometrical design allows the plugs 138 and 142 to completely fill the respective via holes.

Figure 2A:
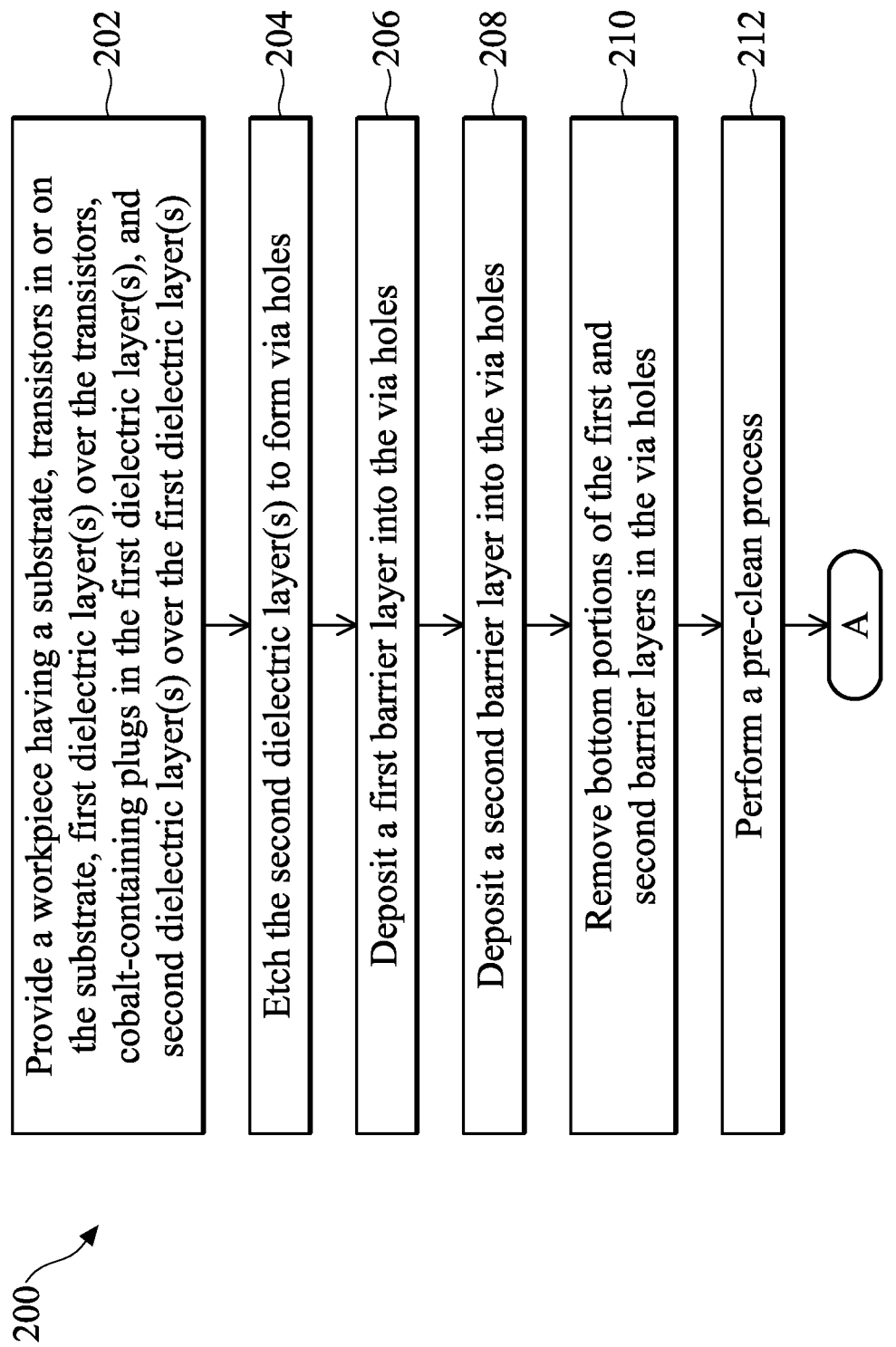
FIGS. 2A and 2B show a flow chart of a method for forming the semiconductor structure shown in FIG. 1, according to aspects of the present disclosure.
Figure 2B:
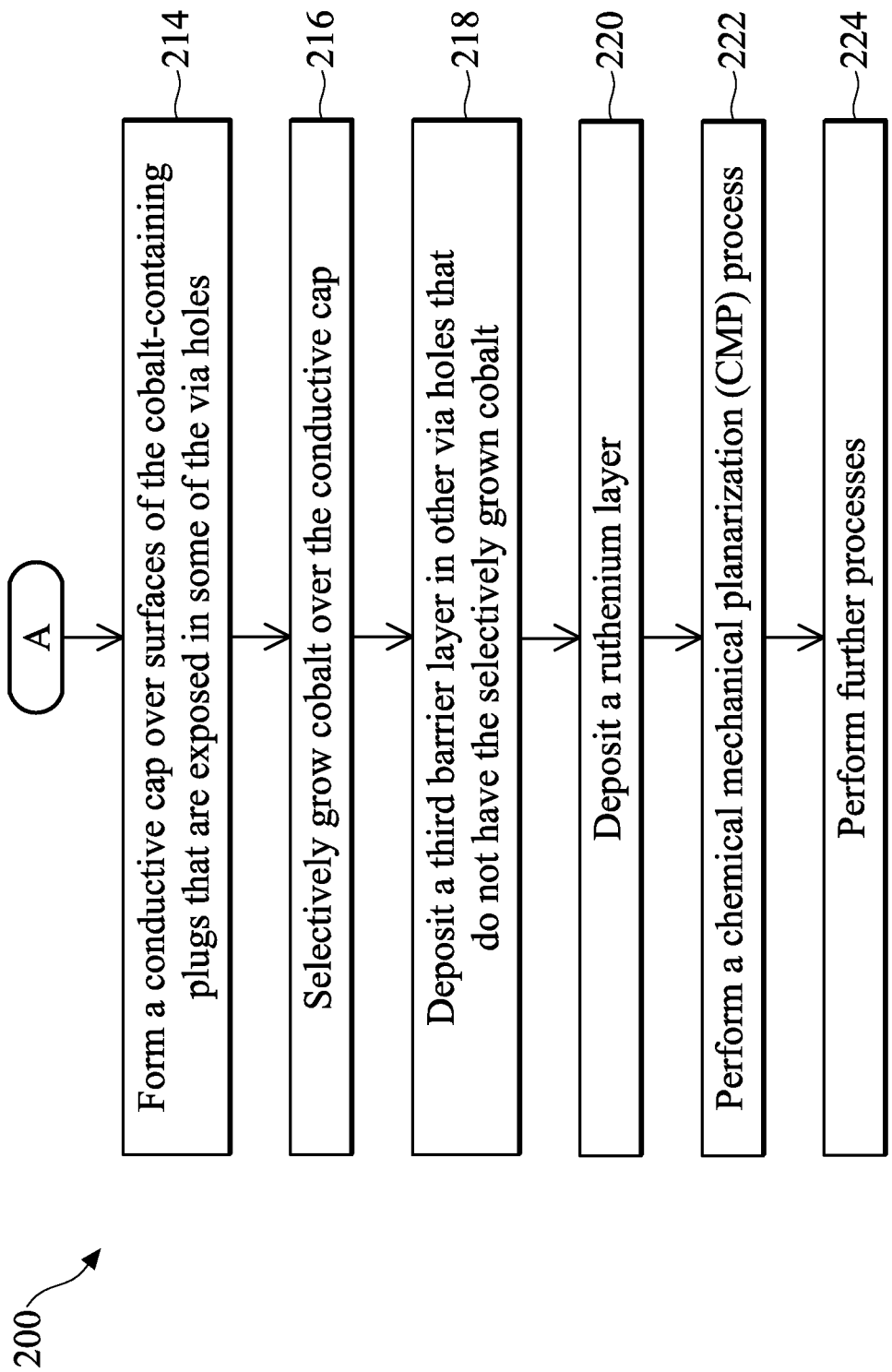

FIGS. 2A and 2B illustrate a flow chart of a method 200 for forming the semiconductor device 100 in accordance with some embodiments. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-12, which illustrate various cross-sectional views of the semiconductor device 100 during fabrication steps according to the method 200.

Figure 3:
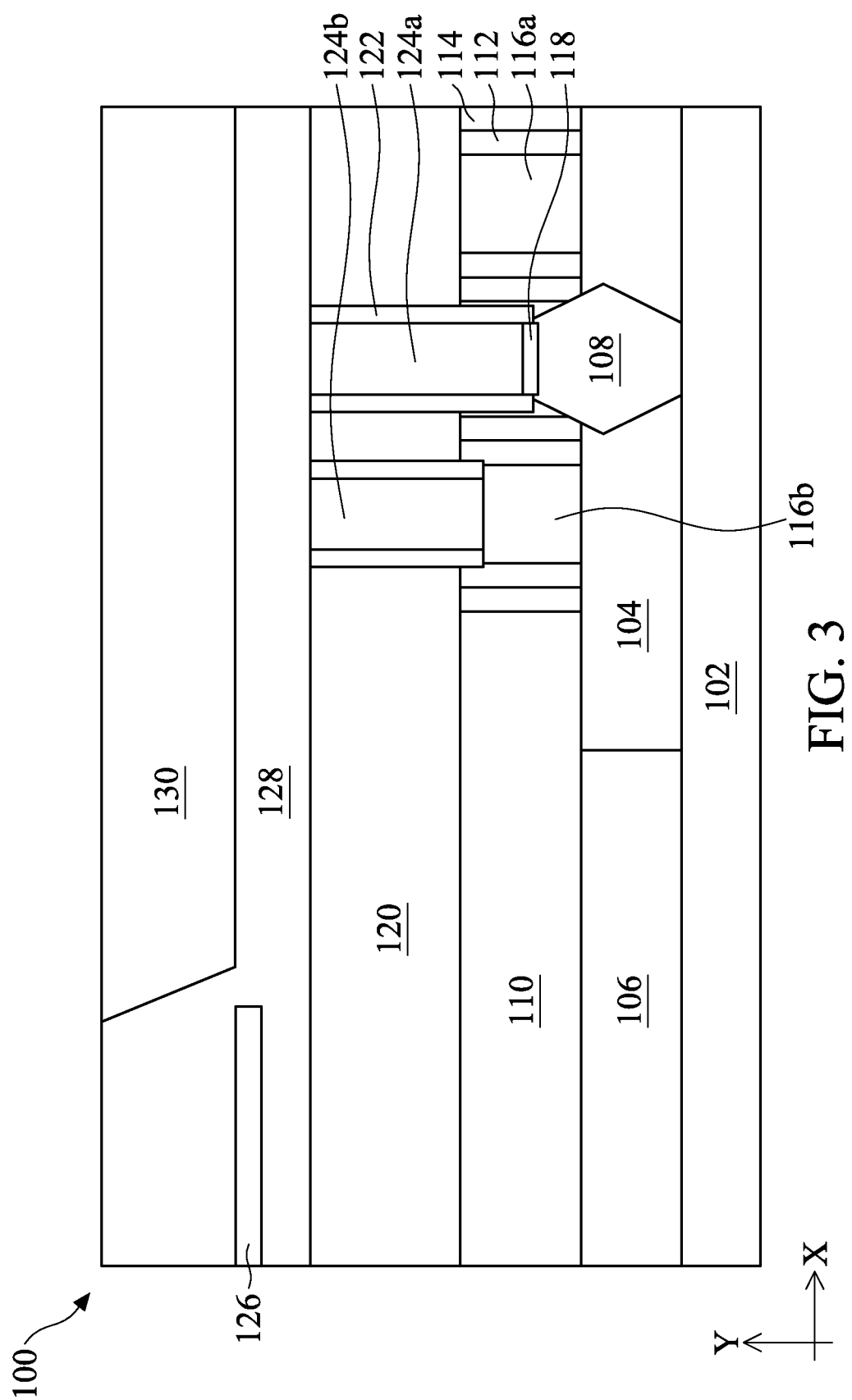
FIGS. 3, 4, 5, 6, 7, 8, 9, 10, 11, and 12 illustrate cross-sectional views of a semiconductor structure during various fabrication steps according to the method of FIGS. 2A-2B, in accordance with some embodiments.

At operation 202, the method 200 (FIG. 2A) provides, or is provided with, a device structure (workpiece) 100, such as shown in FIG. 3. The device structure 100 includes the substrate 102; the active regions 104; the isolation structure 106; the S/D feature 108; the silicide feature 118; the gate stacks 116; the gate spacers 112 and 114; the ILD layers 110, 120, and 130; the Co-containing plugs 124; the barrier layer 122; the conductive feature 126; and the CESL 128. These various features have been discussed above with reference to FIG. 1.

Figure 4:
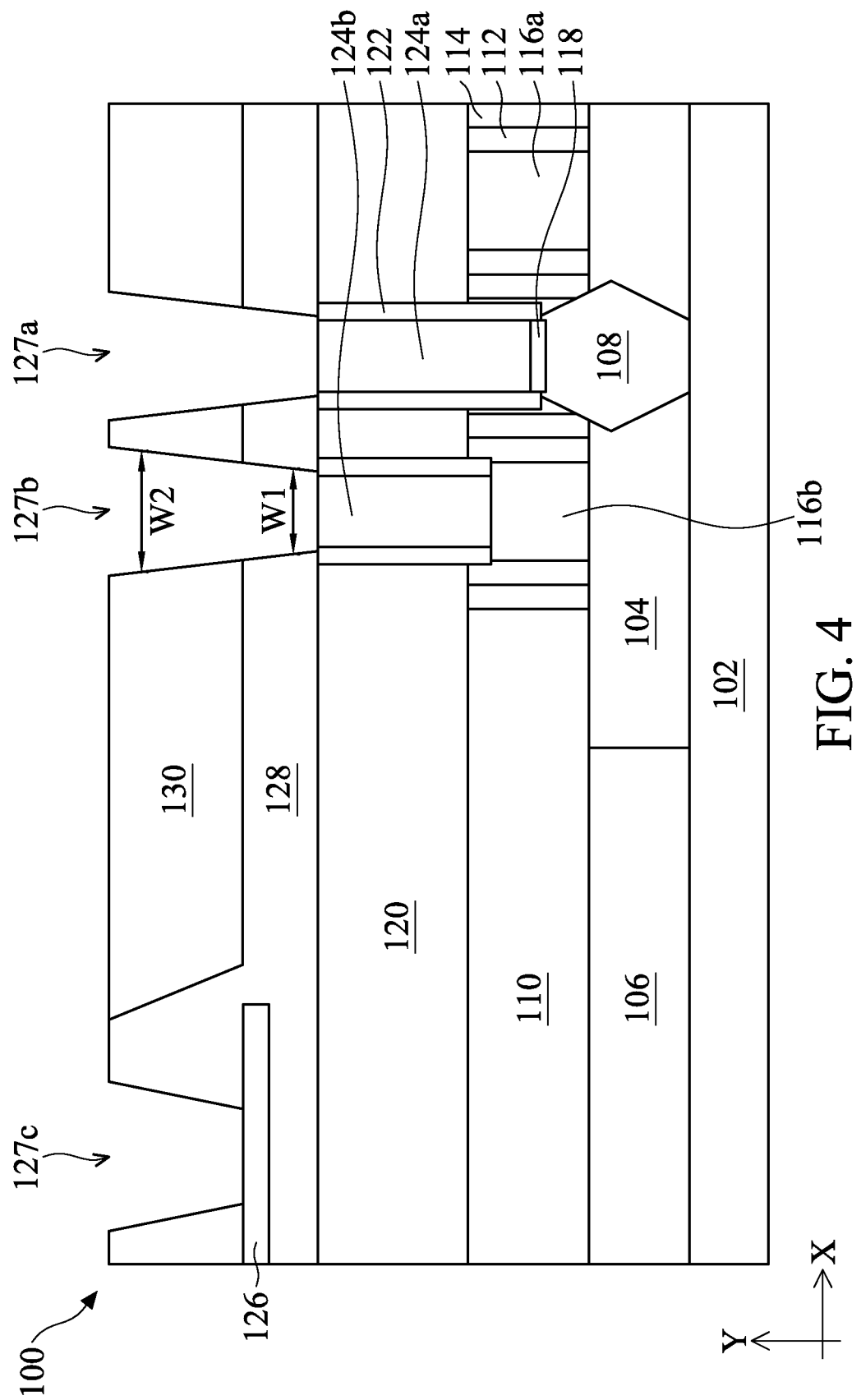

At operation 204, the method 200 (FIG. 2A) etches the ILD layer 130 and the CESL 128 to form via holes 127, including via holes 127a, 127b, and 127c. Referring to FIG. 4, the via holes 127a and 127b are etched above the Co-containing plugs 124a and 124b respectively, and at least partially expose the respective top surface of the Co-containing plugs 124a and 124b. The via hole 127c is etched above the conductive feature 126, and exposes a portion of the top surface of the conductive feature 126. In an embodiment, the operation 204 includes a photolithography process and one or more etching processes. For example, the operation 204 may form a patterned photoresist over the device 100 by photoresist coating, exposing, post-exposure baking, and developing. Then, the operation 204 etches the layers 128 and 130 using the patterned photoresist or a derivative as an etch mask to form the via holes 127. The etching process may include wet etching, dry etching, reactive ion etching, or other suitable etching methods. The patterned photoresist is removed thereafter, for example, by resist stripping. In the present embodiment, the etching processes are controlled to produce a trapezoidal profile in the via holes 127. Particularly, each via hole 127 as a bottom opening width W1 that is at least 50%, but not more than 90%, of the respective top opening width W2 (along the X direction). This allows the material layers (e.g., the layers 132, 134, 140, 138, and 142) to properly fill the via holes 127 in subsequent steps. If the via holes 127 are too upright (e.g., W1 is more than 90% of W2), the lower corners of the via holes 127 may not be properly filled, leaving void defects therein. If the via holes 127 are too slanted (e.g., W1 is less than 50% of W2), the resistance in the plugs 138 and 142 may be too high.

Figure 5:
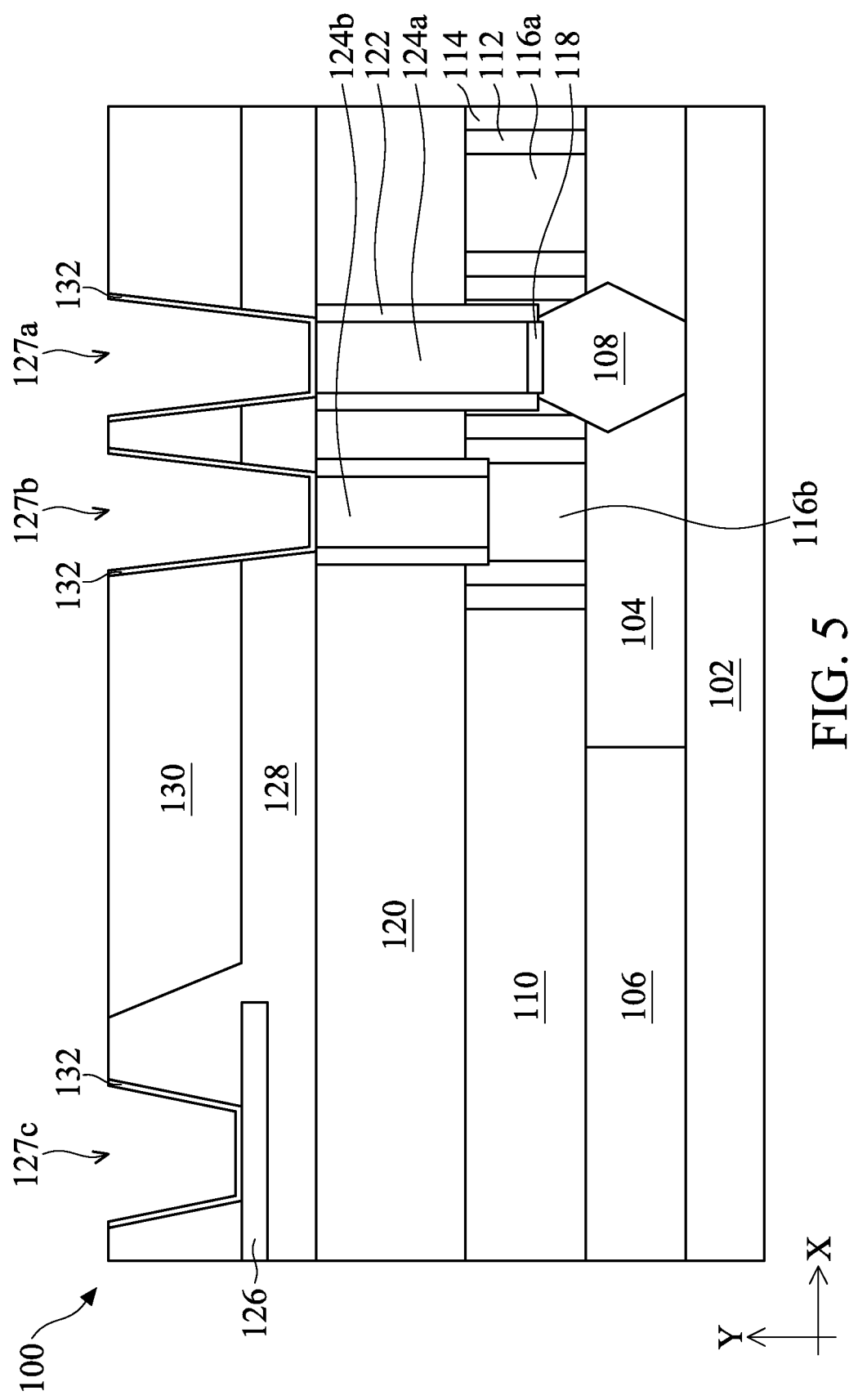

At operation 206, the method 200 (FIG. 2A) deposits the barrier layer 132 into the via holes 127. Referring to FIG. 5, in the present embodiment, the barrier layer 132 is deposited as a substantially conformal layer covering the bottom and sidewall surfaces of the via holes 127. In an embodiment, the barrier layer 132 is deposited to have a thickness about 1 nm to 1.5 nm. The barrier layer 132 includes silicon nitride ($Si_3N_4$) in the present embodiment. The operation 206 may use ALD or CVD methods to deposit the barrier layer 132.

Figure 6:
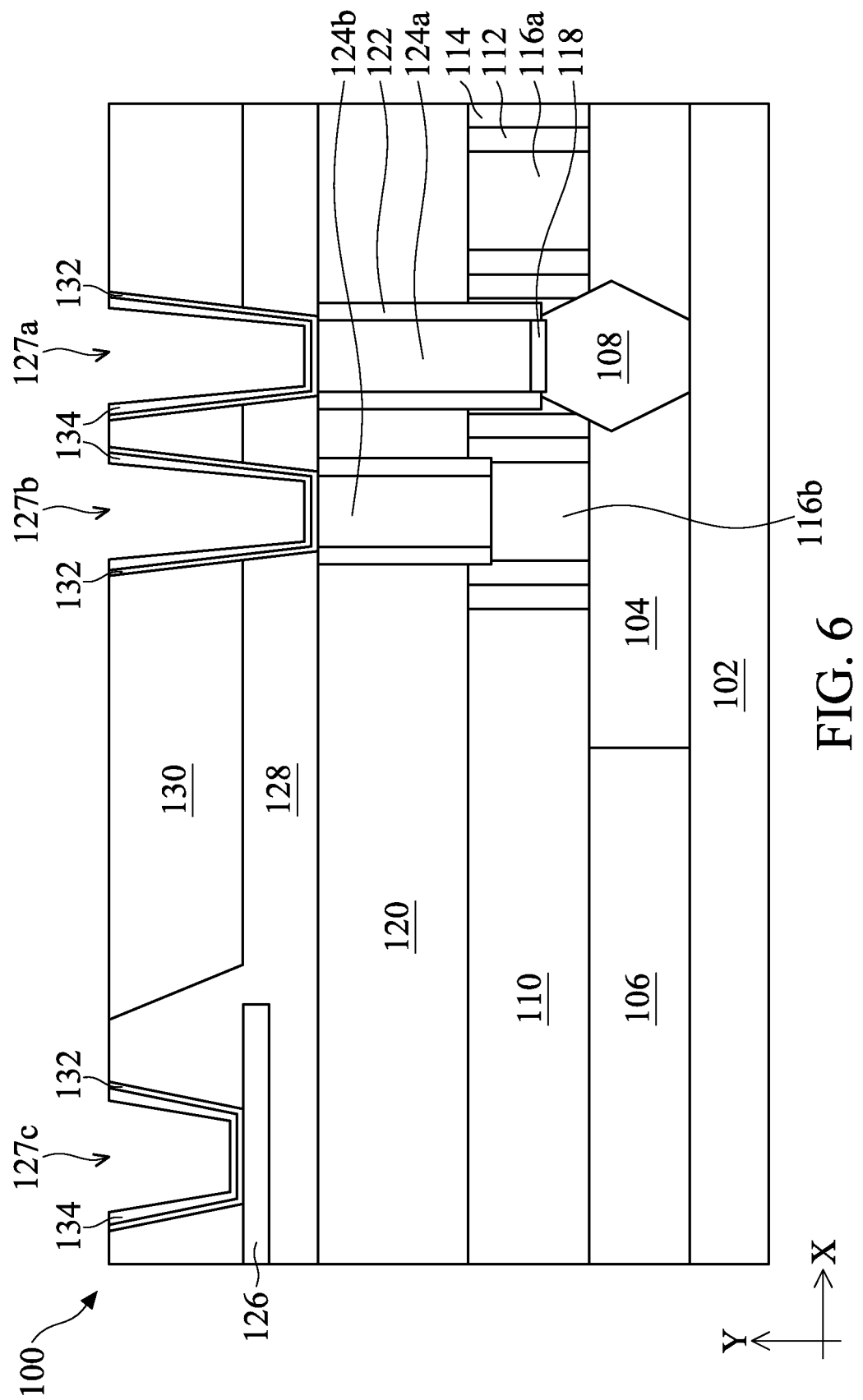

At operation 208, the method 200 (FIG. 2A) deposits the barrier layer 134 into the via holes 127. Referring to FIG. 6, in the present embodiment, the barrier layer 134 is deposited as a substantially conformal layer over the barrier layer 132. In an embodiment, the barrier layer 134 is deposited to have a thickness about 1 nm to 1.5 nm. The barrier layer 134 includes titanium nitride in the present embodiment. In an alternative embodiment, the barrier layer 134 includes tantalum nitride. The operation 208 may use ALD or CVD methods to deposit the barrier layer 134. In an embodiment, the method 200 breaks vacuum between the operations 206 and 208.

Figure 7:
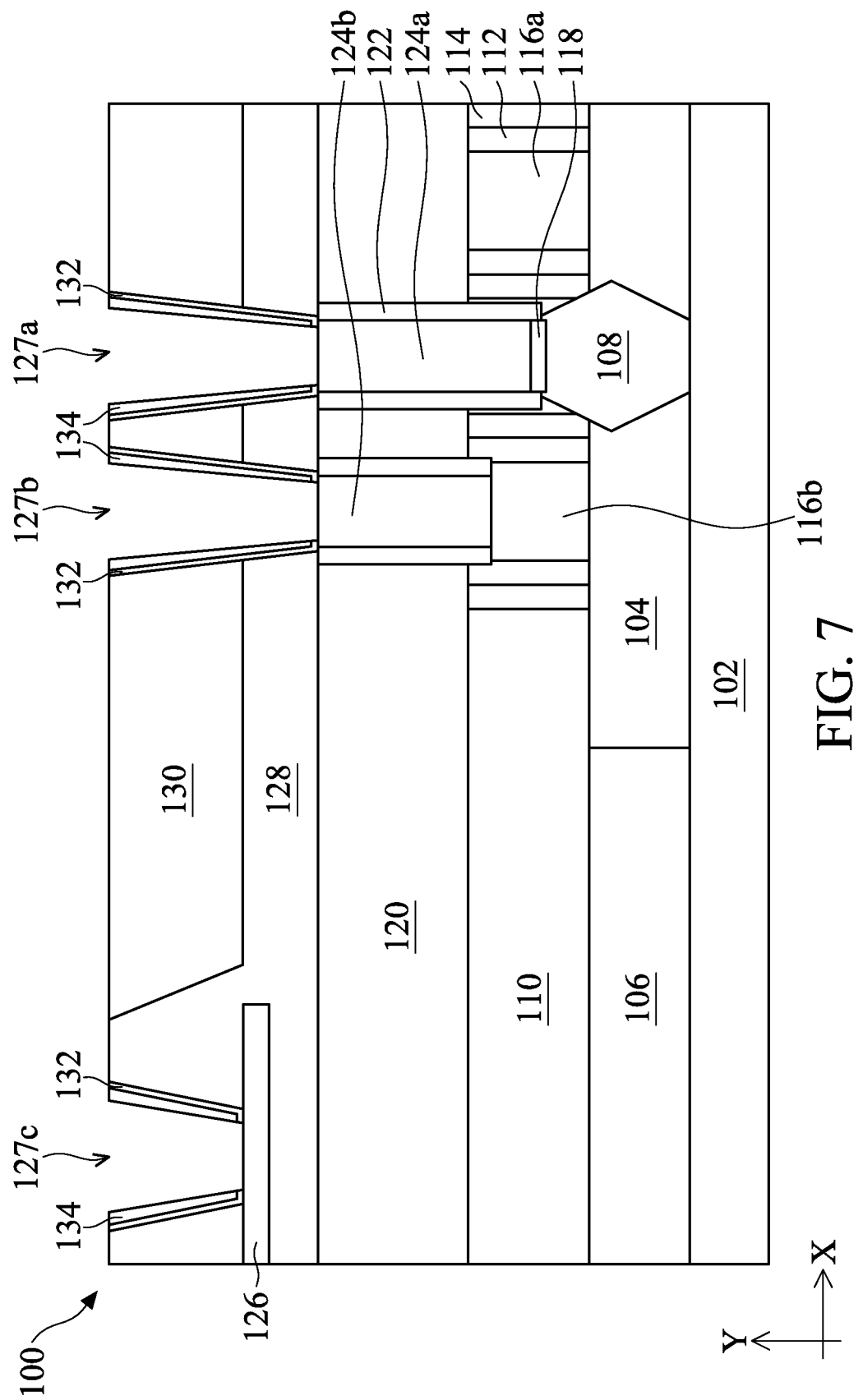

At operation 210, the method 200 (FIG. 2A) etches the barrier layers 134 and 132 to remove their bottom portions in the via holes 127. Referring to FIG. 7, the barrier layers 132 and 134 remain on the sidewalls of the via holes 127, and are removed from the bottom of the via holes 127 to expose the Co-containing plugs 124 and the conductive feature 126. In the present embodiment, the operation 210 uses one or more dry etching processes to etch the barrier layers 134 and 132. Further, the operation 210 may apply a wet cleaning process, such as an SC1 (Standard Clean 1) or SC2 (Standard Clean 2) process, to remove any residues from the top surfaces of the plugs 124 and the conductive feature 126. Due to the slanted profile of the via holes 127, the barrier layer 134 on the sidewalls of the via holes 127 may also experience some loss from the etching and cleaning processes. Such loss is taken into account in the operation 208. In other words, the barrier layer 134 is deposited (by the operation 208) to a sufficient thickness such that, after the operation 210, the barrier layer 134 has about the same thickness as that of the barrier layer 132 in the present embodiment.

In some embodiments, after the operation 210, the top surface of the Co-containing plugs 124 may be slightly oxidized (from ambient air) to include some cobalt oxide compound ($CoO_x$) such as CoO, $Co_3O_4$, and $Co_2O_3$. At operation 212, the method 200 (FIG. 2A) performs a pre-cleaning process to the device 100. Particularly, the pre-cleaning process cleans the top surfaces of the plugs 124 and removes any oxidation thereon. In an embodiment, the operation 212 applies hydrogen ($H_2$) plasma to the device 100, for example, in a pre-cleaning chamber 304 in an in-situ cluster tool 300 depicted in FIG. 14. For example, the $H_2$ plasma may be generated with a 2 MHz radio frequency source (RF2) with a power about 800 W to about 900 W, a 13.56 MHz radio frequency source (RF1) as a bias whose power may range from about 100 W to 150 W, with pure $H_2$ gas at a flow rate of about 20 sccm (standard cubic centimeter per minute) to about 100 sccm, and a total pressure of about 3 mtorr to about 6 mtorr. In an embodiment, the $H_2$ gas may be mixed with some noble gases such as argon. The $H_2$ plasma helps remove any oxidation from the surfaces of the Co-containing plugs 124.

Figure 8:
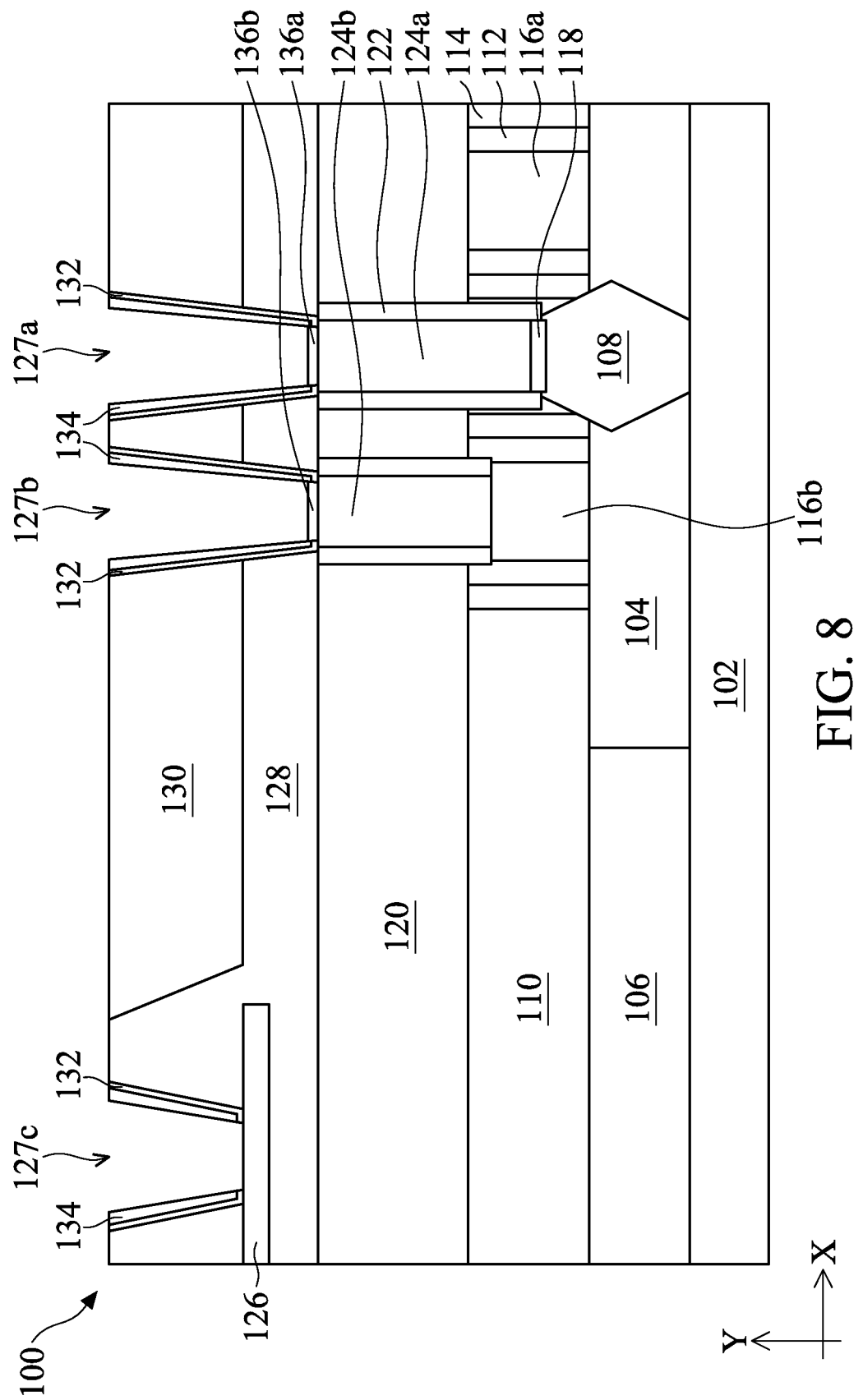

At operation 214, the method 200 (FIG. 2B) performs a selective deposition process to deposit the conductive caps 136 over the Co-containing plugs 124, but not over the conductive feature 126 that is free of cobalt. Referring to FIG. 8, the conductive caps 136a and 136b are deposited over and in direct contact with the Co-containing plugs 124a and 124b respectively, while the top surface of the conductive feature 126 remains exposed through the via hole 127c. In an embodiment, the operation 214 may be performed in a deposition chamber 316 in the in-situ cluster tool 300 (FIG. 14) without breaking vacuum subsequent to the operation 212. In an embodiment, the operation 214 selectively deposits tungsten (W) as the conductive caps 136. For example, the selective W deposition may be performed at a temperature about 250° C. to about 300° C., a total pressure about 5 torr to about 15 torr, and using $WF_6$ and $H_2$ as the reaction gases. Such low temperature and low pressure are desirable for the operation 214 because high temperature and/or high-pressure may result in non-selective W deposition. The conductive caps 136 may be deposited to about 300 Å to about 500 Å thick. The thickness thereof may be controlled by a process timer. In another embodiment, the operation 214 selectively deposits cobalt silicide ($CoSi_x$) as the conductive caps 136. For example, the operation 214 may deposit cobalt silicide at temperature about 250° C. to about 500° C., a total pressure about 5 torr to about 55 torr, and using $SiH_4$ as the reaction gas.

Figure 9:
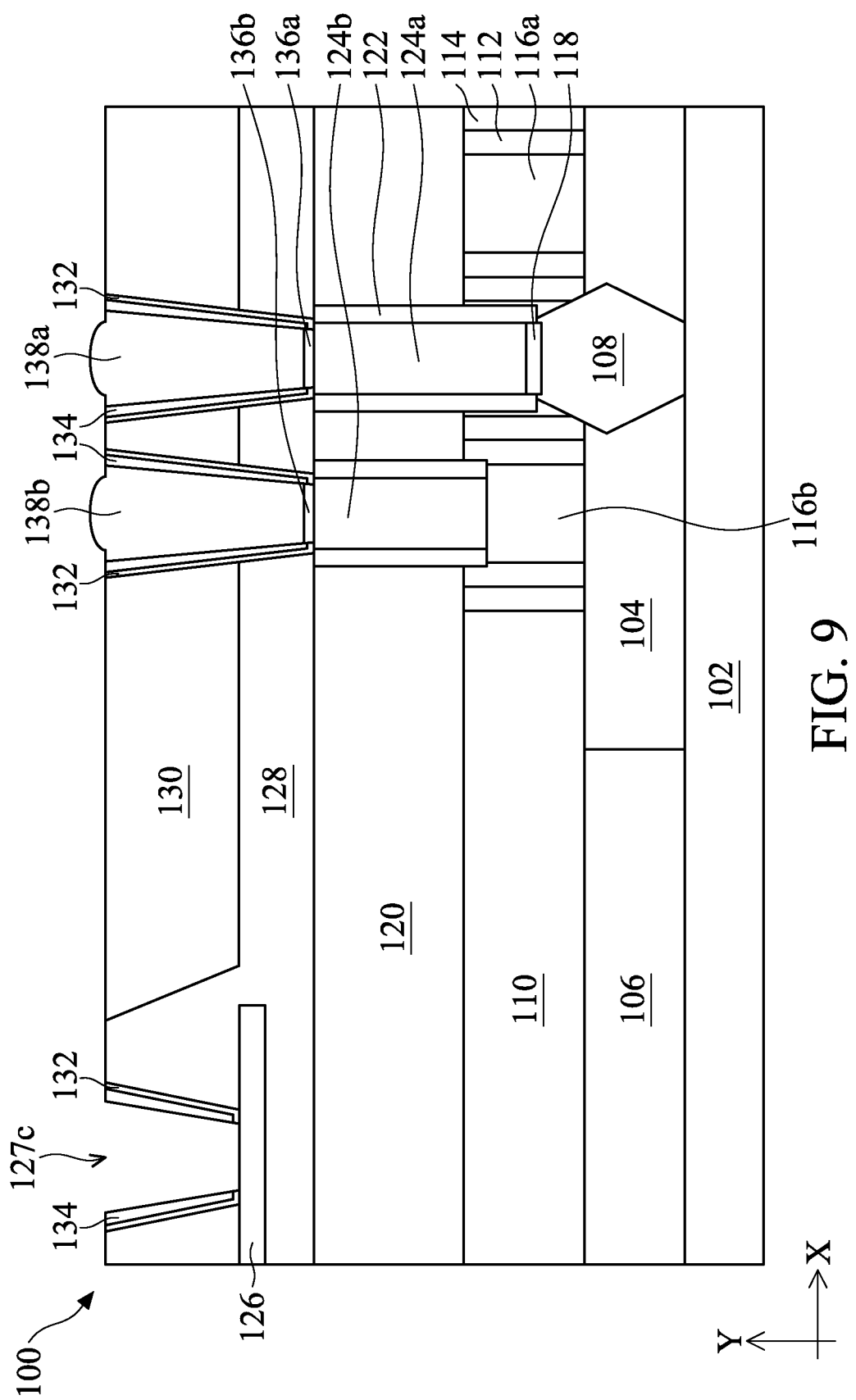

At operation 216, the method 200 (FIG. 2B) selectively grows cobalt (Co) on the conductive caps 136, but not on the conductive feature 126. Referring to FIG. 9, the Co-containing plugs 138a and 138b are grown over the conductive caps 136a and 136b, respectively, and completely fill the via holes 127a and 127b. The via hole 127c remains open, with the top surface of the conductive feature 126 exposed there through. In an embodiment, the operation 216 may be performed in a deposition chamber 308 in the in-situ cluster tool 300 (FIG. 14) without breaking vacuum subsequent to the operation 214. For example, the selective Co deposition may be performed at a temperature about 150° C. to about 300° C., a total pressure about 5 torr to about 15 torr, and using $C_5H_5Co(CO)_2$ (Cyclopentadienylcobalt dicarbonyl) and $H_2$ as the reaction gases. Such low temperature and low pressure are desirable for the operation 216 because high temperature and/or high-pressure may result in non-selective Co deposition. The Co-containing plugs 138 may be deposited to about 300 Å to about 1500 Å thick. The thickness thereof may be controlled by a process timer.

Figure 10:
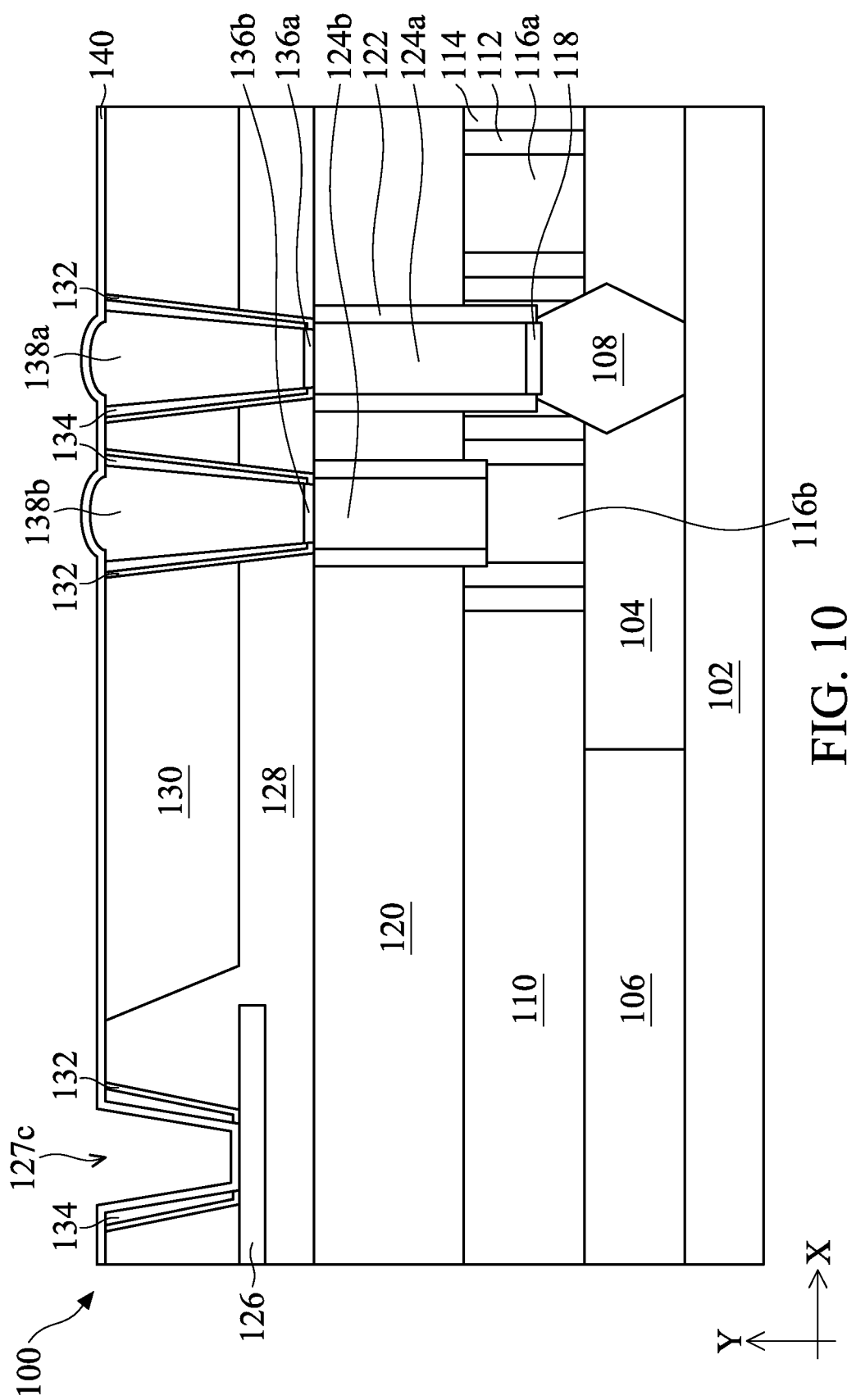

At operation 218, the method 200 (FIG. 2B) deposits a barrier layer 140 over the device 100. Referring to FIG. 10, the barrier layer 140 is deposited to have substantially uniform thickness on the surface of the device 100, particularly on the bottom and sidewall surfaces of the via hole 127c. In an embodiment, the barrier layer 140 includes titanium nitride (TiN) or tantalum nitride (TaN) that is deposited using ALD. In an embodiment, the operation 218 may be performed in a deposition chamber 312 or 314 in the in-situ cluster tool 300 (FIG. 14) without breaking vacuum subsequent to the operation 216. For example, the deposition of the barrier layer 140 may be performed at a temperature about 250° C. to about 400° C., a total pressure about 0.5 torr to about 5 torr, and using TDMAT (Tetrakis(dimethylamido) titanium) (for TiN deposition) or PDMAT (Pentakis(dimethylamino)tantalum) (for TaN deposition) as the precursor. The barrier layer 140 may be deposited to about 10 Å to about 20 Å thick. The thickness of the barrier layer 140 may be controlled by the number of ALD cycles.

Figure 11:
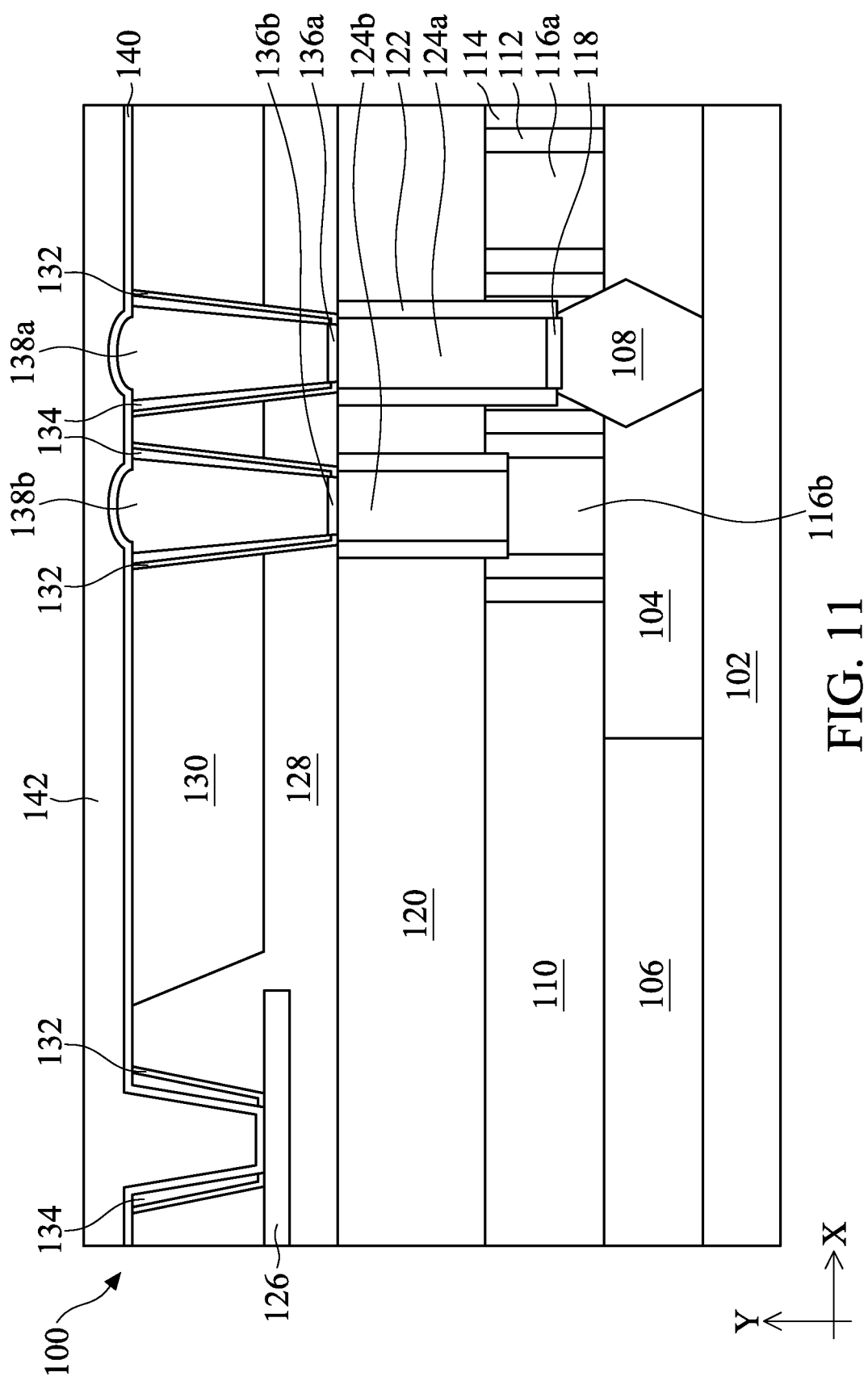

At operation 220, the method 200 (FIG. 2B) deposits a Ru-containing layer 142 over the device 100. Referring to FIG. 11, the Ru-containing layer 142 is deposited to cover the surface of the device 100 and fill the via hole 127c. In an embodiment, the operation 220 performs a CVD process to deposit the layer 142, for example, in a deposition chamber 310 in the in-situ cluster tool 300 (FIG. 14) without breaking vacuum subsequent to the operation 218. For example, the deposition of the layer 142 may be performed at a temperature about 150° C. to about 300° C., a total pressure about 5 torr to about 15 torr, and using $Ru_3(CO)_{12}$ (Triruthenium dodecacarbonyl) and $H_2$ as the reaction gases. The Ru-containing plugs 142 may be deposited to about 300 Å to about 1500 Å thick. The thickness thereof may be controlled by a process timer.

Figure 12:
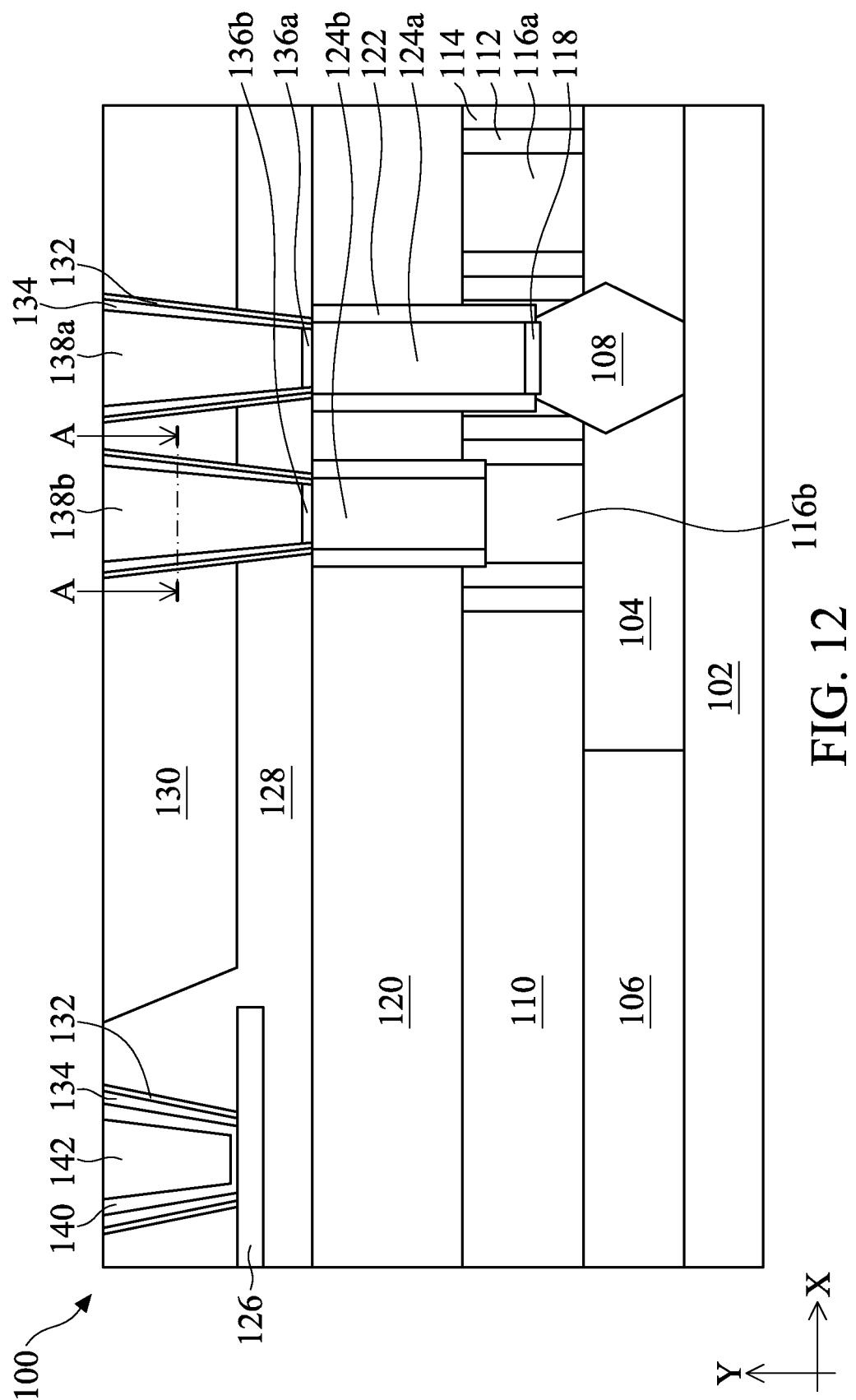

At operation 222, the method 200 (FIG. 2B) performs a chemical mechanical planarization (CMP) process to the device 100. Referring to FIG. 12, the Ru-containing layer 142 and the barrier layer 140 are removed by the CMP process except in the via hole 127c. The remaining portion of the Ru-containing layer 142 becomes the Ru-containing plug 142.

At operation 224, the method 200 (FIG. 2B) performs further processes to the device 100. For example, the operation 224 may deposit another etch stop layer (ESL) and another ILD layer over the ILD layer 130, etch the newly deposited ESL and ILD layers to form trenches, and deposit a metal (e.g., copper) in the trenches to form metal wires. The metal wires are configured to interconnect the various via plugs 138 and 142 as well as other circuit features. The operation 224 may repeat such process to build any number of layers of metal wires.

Figure 13:
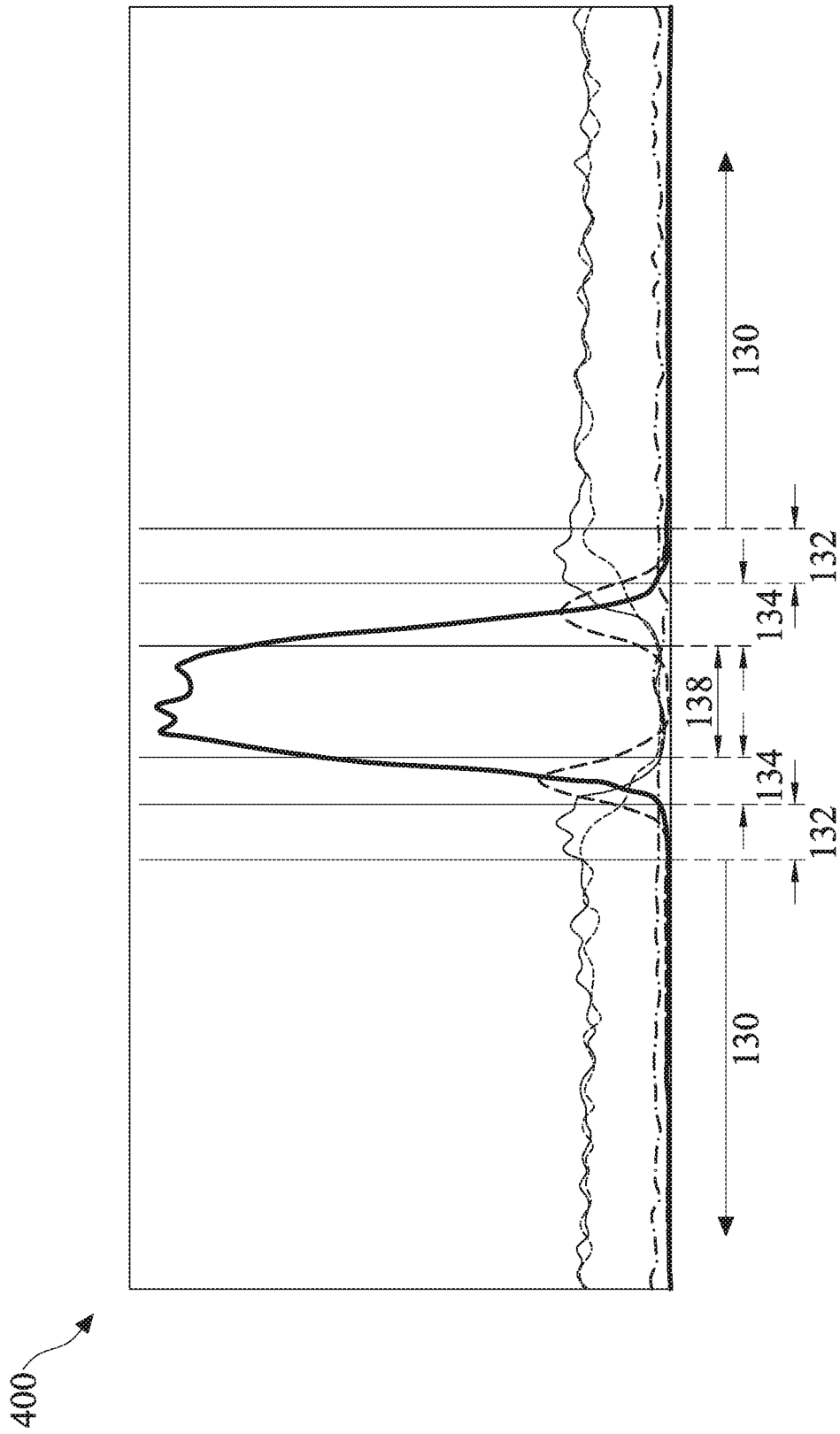
FIG. 13 shows an element analysis in part of the semiconductor structure constructed according to aspects of the present disclosure.

FIG. 13 illustrates some chemical analysis of an embodiment of the device 100 along the A-A line of FIG. 12. Referring to FIG. 13, the plug 138 includes primarily Co or consists essentially of Co in this embodiment, the barrier layer 134 includes TiN, the barrier layer 132 includes silicon nitride ($Si_3N_4$), and the ILD layer 130 includes primarily silicon oxide ($SiO_2$). Some Co elements diffuse from the Co-containing plug 138 into the barrier layer 134. Some small amount of Co elements even diffuses into the barrier layer 132. But the ILD layer 130 is substantially free of the Co elements, which demonstrates the effectiveness of the dual barrier layer 132 and 134.

Figure 14:
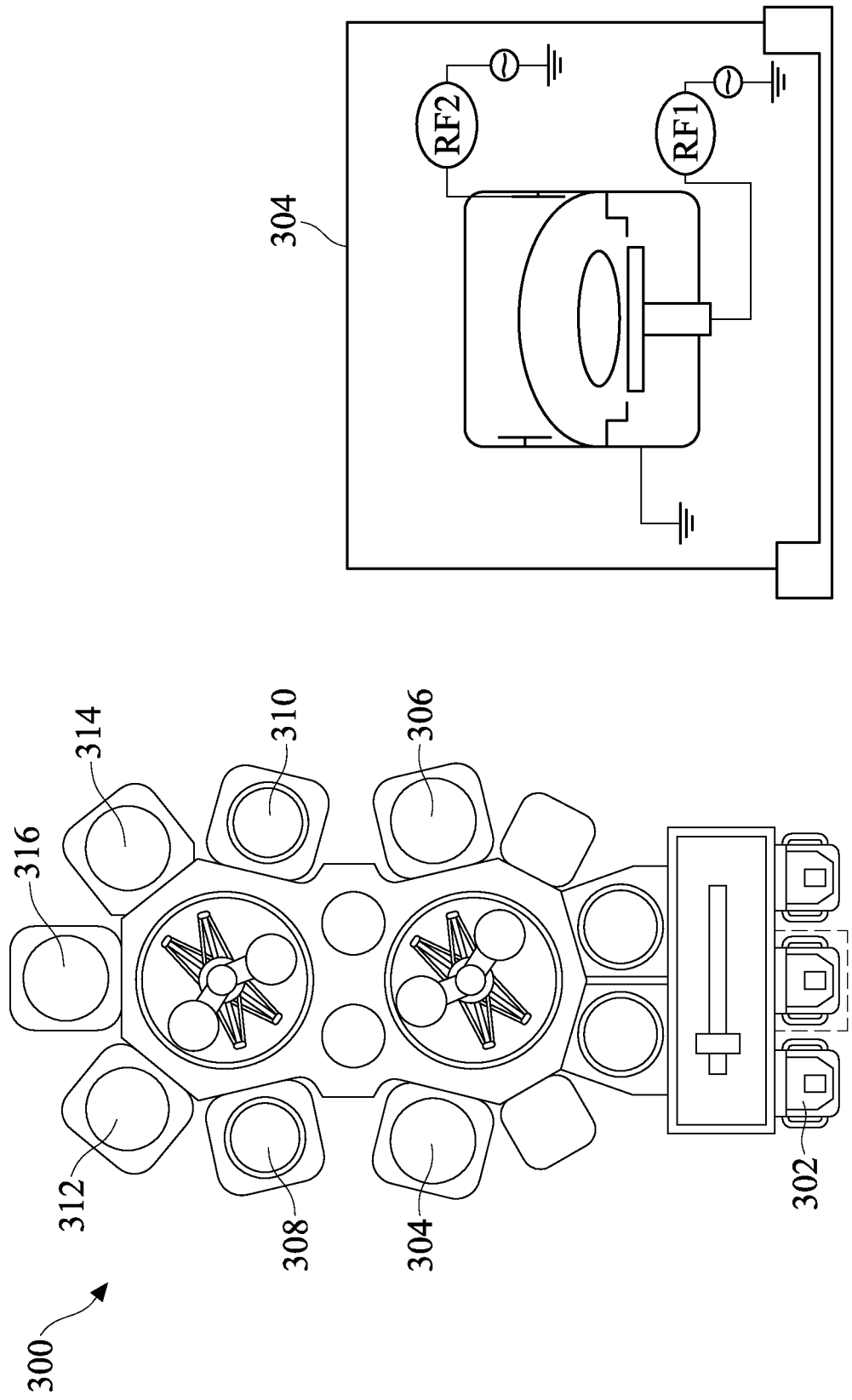
FIG. 14 shows an in-situ cluster tool that may be used to perform some of the fabrication steps according to the method of FIGS. 2A-2B, in accordance with some embodiments.

FIG. 14 illustrates the in-situ cluster tool 300 for performing some fabrication steps of the method 200, and further illustrates a schematic blowup view of the process chamber 304. Referring to FIG. 14, the cluster tool 300 includes input/output ports (e.g., load docks) 302 for connecting to other process tools, for example, through an overhead transport system. The cluster tool 300 further includes various process chambers 304, 306, 308, 310, 312, 314, and 316. For example, the process chambers 304 and 306 may be configured to perform cleaning processes, such as the pre-cleaning process in the operation 212; the process chamber 308 may be configured to perform cobalt deposition in the operation 216; the process chamber 310 may be configured to perform ruthenium deposition in the operation 220; the process chamber 312 may be configured to perform ALD TaN deposition in the operation 218; the process chamber 314 may be configured to perform ALD TiN deposition in the operation 218; and the process chamber 316 may be configured to perform W deposition in the operation 214.

Although not intended to be limiting, one or more embodiments of the present disclosure provide many benefits to a semiconductor device and the formation thereof. For example, embodiments of the present disclosure provide ultra-low resistance via plugs having cobalt and/or ruthenium as the main metal, and further having thin dual barrier layers to prevent Co and Ru elements from diffusing into nearby oxygen-containing dielectric layers. Such via plugs are able to completely fill small via holes, meeting the demands for continued device down-scaling. Embodiments of the disclosed methods can be readily integrated into existing manufacturing processes.

In one aspect, the present disclosure is directed to a semiconductor device. The semiconductor device includes an active region over a substrate; a first cobalt-containing feature disposed over the active region; a conductive cap disposed over and in physical contact with the first cobalt-containing feature; and a second cobalt-containing feature disposed over and in physical contact with the conductive cap.

In an embodiment, the semiconductor device further includes a first barrier layer having titanium nitride disposed over sidewalls of the second cobalt-containing feature and the conductive cap; and a second barrier layer having silicon nitride disposed over the first barrier layer. In a further embodiment, the semiconductor device includes a contact etch stop layer disposed over a lower portion of sidewalls of the second barrier layer; and an interlayer dielectric layer disposed over the contact etch stop layer and over an upper portion of the sidewalls of the second barrier layer. In an embodiment, the semiconductor device further includes a conductive feature embedded in the contact etch stop layer; and a ruthenium-containing feature disposed over and in electrical contact with the conductive feature. In a further embodiment, the semiconductor device includes a third barrier layer over sidewalls of the ruthenium-containing feature, wherein the third barrier layer includes TaN or TiN, wherein the first and second barrier layers are further disposed on sidewalls of the third barrier layer.

In some embodiments, a total thickness of the first and second barrier layers is greater than a depth of diffusion by cobalt elements from the second cobalt-containing feature into the first and second barrier layers. In some embodiments, the first and second barrier layers have about a same thickness and a total thickness of the first and second barrier layers is about 2 nm to about 3 nm.

In some embodiments, the conductive cap includes tungsten or cobalt silicide ($CoSiO_x$). In some embodiments of the semiconductor device, more than 60% of cobalt grains in the second cobalt-containing feature have a grain size about 11 nm to about 13 nm. In some further embodiments, other cobalt grains in the second cobalt-containing feature have a grain size below 10 nm. In some embodiments, the first cobalt-containing feature is electrically connected to a transistor source/drain feature or a transistor gate feature.

In another aspect, the present disclosure is directed to a semiconductor device. The semiconductor device includes a first cobalt-containing plug disposed over a substrate; a conductive cap disposed over and in physical contact with the first cobalt-containing plug; a second cobalt-containing plug disposed over and in physical contact with the conductive cap; a first barrier layer over sidewalls of the second cobalt-containing plug and the conductive cap; a second barrier layer over sidewalls of the first barrier layer; and one or more dielectric layers surrounding the second barrier layer.

In an embodiment, the first barrier layer includes titanium nitride, the second barrier layer includes silicon nitride, and the one or more dielectric layers include silicon oxide. In some embodiments, the semiconductor device further includes a titanium nitride layer embedded in the one or more dielectric layers; and a ruthenium-containing plug disposed over and in electrical connection with the titanium nitride layer. In a further embodiment, the semiconductor device includes a third barrier layer surrounding the ruthenium-containing plug, wherein the first and second barrier layers are also disposed between the third barrier layer and the one or more dielectric layers.

In yet another aspect, the present disclosure is directed to a method. The method includes providing a structure having a substrate, one or more first dielectric layers over the substrate, a first cobalt-containing plug embedded in the one or more first dielectric layers, and one or more second dielectric layers over the one or more first dielectric layers and the first cobalt-containing plug. The method further includes etching a via hole into the one or more second dielectric layers to expose the first cobalt-containing plug; depositing a first barrier layer having silicon nitride into the via hole; depositing a second barrier layer having titanium nitride or tantalum nitride into the via hole and over the first barrier layer; etching the first and second barrier layers in the via hole to expose the first cobalt-containing plug; forming a conductive cap over the first cobalt-containing plug that is exposed in the via hole; and selectively growing cobalt over the conductive cap.

In some embodiments of the method, the forming of the conductive cap includes selectively growing tungsten over the first cobalt-containing plug using $WF_6$ and $H_2$ as reaction gas. In some embodiments, the selectively growing cobalt is performed using $C_5H_5(CO)_2Co$ and $H_2$ as reactive gas.

In some embodiments, the method further includes cleaning an exposed surface of the first cobalt-containing plug using $H_2$ plasma before the forming of the conductive cap. In some embodiments, the structure further includes a conductive feature embedded in the one or more second dielectric layers, and the method further includes etching a second via hole into the one or more second dielectric layers to expose the conductive feature; depositing the first barrier layer in the second via hole; depositing the second barrier layer in the second via hole; etching the first and second barrier layers in the second via hole to expose the conductive feature; depositing a third barrier layer having tantalum nitride or titanium nitride in the second via hole; and depositing a ruthenium-containing plug in the second via hole and over the third barrier layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an active region over a substrate;
   a first cobalt-containing feature disposed over the active region;
   a conductive cap disposed over and in physical contact with the first cobalt-containing feature;
   a second cobalt-containing feature disposed over and in physical contact with the conductive cap;
   a first barrier layer disposed over sidewalls of the second cobalt-containing feature and the conductive cap, wherein the first barrier layer is in physical contact with the second cobalt-containing feature; and
   a second barrier layer disposed over the first barrier layer.

2. The semiconductor device of claim 1, wherein the first barrier layer includes titanium nitride and the second barrier layer includes silicon nitride.

3. The semiconductor device of claim 2, further comprising:
a contact etch stop layer disposed over a lower portion of sidewalls of the second barrier layer; and
an interlayer dielectric layer disposed over the contact etch stop layer and over an upper portion of the sidewalls of the second barrier layer.

4. The semiconductor device of claim 3, further comprising:
a conductive feature embedded in the contact etch stop layer; and
a ruthenium-containing feature disposed over and in electrical contact with the conductive feature.

5. The semiconductor device of claim 4, further comprising:
a third barrier layer over sidewalls of the ruthenium-containing feature, wherein the third barrier layer includes TaN or TiN, wherein the first and second barrier layers are further disposed on sidewalls of the third barrier layer.

6. The semiconductor device of claim 2, wherein a total thickness of the first and second barrier layers is greater than a depth of diffusion by cobalt elements from the second cobalt-containing feature into the first and second barrier layers.

7. The semiconductor device of claim 2, wherein the first and second barrier layers have about a same thickness and a total thickness of the first and second barrier layers is about 2 nm to about 3 nm.

8. The semiconductor device of claim 1, wherein the conductive cap includes tungsten or cobalt silicide ($CoSi_x$).

9. The semiconductor device of claim 1, wherein more than 60% of cobalt grains in the second cobalt-containing feature have a grain size about 11 nm to about 13 nm.

10. The semiconductor device of claim 9, wherein other cobalt grains in the second cobalt-containing feature have a grain size below 10 nm.

11. The semiconductor device of claim 1, wherein the first cobalt-containing feature is electrically connected to a transistor source/drain feature or a transistor gate feature.

12. A semiconductor device, comprising:
a first cobalt-containing plug disposed over a substrate;
a conductive cap disposed over and in physical contact with the first cobalt-containing plug;
a second cobalt-containing plug disposed over and in physical contact with the conductive cap, wherein a bottom surface of the second cobalt-containing plug is spaced apart from a top surface of the first cobalt-containing plug;
a first barrier layer over sidewalls of the second cobalt-containing plug and the conductive cap;
a second barrier layer over sidewalls of the first barrier layer; and
one or more dielectric layers surrounding the second barrier layer.

13. The semiconductor device of claim 12, wherein the first barrier layer includes titanium nitride, the second barrier layer includes silicon nitride, and the one or more dielectric layers include silicon oxide.

14. The semiconductor device of claim 12, further comprising:
a titanium nitride layer embedded in the one or more dielectric layers; and
a ruthenium-containing plug disposed over and in electrical connection with the titanium nitride layer.

15. The semiconductor device of claim 14, further comprising:
a third barrier layer surrounding the ruthenium-containing plug, wherein the first and second barrier layers are also disposed between the third barrier layer and the one or more dielectric layers.

16. A method, comprising:
providing a structure having a substrate, one or more first dielectric layers over the substrate, a first cobalt-containing plug embedded in the one or more first dielectric layers, and one or more second dielectric layers over the one or more first dielectric layers and the first cobalt-containing plug;
etching a via hole into the one or more second dielectric layers to expose the first cobalt-containing plug;
depositing a first barrier layer having silicon nitride into the via hole;
depositing a second barrier layer having titanium nitride or tantalum nitride into the via hole and over the first barrier layer;
etching the first and second barrier layers in the via hole to expose the first cobalt-containing plug;
forming a conductive cap over the first cobalt-containing plug that is exposed in the via hole; and
selectively growing cobalt over the conductive cap.

17. The method of claim 16, wherein the forming of the conductive cap includes selectively growing tungsten over the first cobalt-containing plug using $WF_6$ and $H_2$ as reaction gas.

18. The method of claim 16, wherein the selectively growing cobalt is performed using $C_5H_5(CO)_2Co$ and $H_2$ as reactive gas.

19. The method of claim 16, further comprising:
cleaning an exposed surface of the first cobalt-containing plug using $H_2$ plasma before the forming of the conductive cap.

20. The method of claim 16, wherein the structure further includes a conductive feature embedded in the one or more second dielectric layers, further comprising:
etching a second via hole into the one or more second dielectric layers to expose the conductive feature;
depositing the first barrier layer in the second via hole;
depositing the second barrier layer in the second via hole;
etching the first and second barrier layers in the second via hole to expose the conductive feature;
depositing a third barrier layer having tantalum nitride or titanium nitride in the second via hole; and
depositing a ruthenium-containing plug in the second via hole and over the third barrier layer.

* * * * *